United States Patent [19]

Gaiser

[11] Patent Number: 4,831,285

[45] Date of Patent: May 16, 1989

[54] SELF PRECHARGING STATIC PROGRAMMABLE LOGIC ARRAY

[75] Inventor: Thomas A. Gaiser, Salem, N.H.

[73] Assignee: National Semiconductor Corporation, Santa Clara, Calif.

[21] Appl. No.: 145,018

[22] Filed: Jan. 19, 1988

[51] Int. Cl.[4] .................. H03K 17/284; H03K 19/177
[52] U.S. Cl. .................................... 307/465; 307/443; 307/469; 307/471; 307/481; 307/592; 307/594; 307/601; 364/716
[58] Field of Search ................ 307/443, 448, 451–453, 307/465, 468, 469, 471, 480–481, 272 R, 592, 594, 601; 364/716

[56] References Cited

U.S. PATENT DOCUMENTS

| | | | |
|---|---|---|---|
| 4,233,667 | 11/1980 | Devine et al. | 364/716 X |
| 4,563,599 | 1/1986 | Donoghue et al. | 307/448 |
| 4,611,133 | 9/1986 | Peterson et al. | 307/481 X |
| 4,697,105 | 9/1987 | Moy | 307/481 X |
| 4,728,820 | 3/1988 | Lee | 307/481 X |
| 4,728,827 | 3/1988 | Woo | 307/468 X |
| 4,764,691 | 8/1988 | Jochem | 307/452 X |

*Primary Examiner*—David Hudspeth
*Attorney, Agent, or Firm*—Lee Patch; Mark Aaker; David H. Carroll

[57] ABSTRACT

A programmable logic array having a number of inputs for receiving operand data and a number of outputs for furnishing the results of Boolean operations upon the operand data is provided with a precharge signal generator responsive to a state transition in the operand data for generating a precharge signal. The buffered operand data is furnished to an AND plane, and pullup circuits associated therewith are responsive to the precharge signal for charging the AND plane and sustaining the charge on all AND plane array lines in the logical ONE state. An OR plane is connected to the outputs of the AND plane, and pullup transistors associated with the OR plane and responsive to the precharge signal for charging the OR plane and sustaining the charge on all OR plane array lines in the logical ONE state. The PLA outputs are taken from the buffered outputs of the OR plane.

10 Claims, 4 Drawing Sheets

SELF PRECHARGING STATIC PROGRAMMABLE LOGIC ARRAY

BACKGROUND OF THE INVENTION

This invention relates to programmable logic arrays, and more particularly to static programmable logic arrays.

Programmable logic arrays, also known as PLAs, comprise an array of logical AND and OR gates which is programmed for specific functions. Each output function is the sum (logical OR) of selected products (logical AND) of the inputs. In CMOS technology, the AND plane is implemented as a NOR array with inverted inputs, and the OR plane is implemented as a NOR array with inverted outputs. PLAs are useful in implementing a variety of functions, including random logic networks, data routing, code conversion, instruction decoding, and state sequences.

Programmable logic arrays include the static, precharged, and dynamic types. Static PLAs are able to maintain charge on the internal nodes; several designs are described below. The precharge and dynamic PLAs must be provided with external precharge and evaluate signals. Generally, precharge and dynamic PLAs also require that the precharge or clock signal be provided at a certain minimum frequency to maintain charge on the internal nodes.

In order to avoid DC power dissipation, the NOR array of the static type of PLA has been designed either as a fully complementary array or, more commonly, as a complementary NMOS array with cross coupled PMOS pullup transistors. In fully complementary designs, each branch of the NOR array comprises a NMOS section and a PMOS section, one of which being a parallel circuit while the other a series circuit. FIG. 1 is an example of a typical branch of a NOR array comprising NMOS parallel circuit section 10 and PMOS series circuit section 12. When any one or more of the NMOS transistors in the parallel section 10 are ON and pulling the output 13 to logical zero, the corresponding PMOS transistor or transistors in the PMOS series section 12 are OFF, thereby preventing DC current draw. This design approach has several drawbacks. The size of the NOR array is large, as two full MOS arrays are required. The performance of the NOR array deteriorates with increasing size, and the functionality cannot be guaranteed. Moreover, the reliability of the NOR array is difficult to ensure, due to the large number of devices in the design.

In complementary NMOS array designs, NOR circuit 14 and its complementary tree 16 are implemented with NMOS transistors, and cross-coupled PMOS pullup transistors 18 and 20 are used at the top of the arrays. When any one or more of the transistors in the parallel circuit 14 is ON and pulling the output 21 to logical zero, the corresponding transistor or transistors in the series section 16 are OFF. As a result, PMOS transistor 18 turns ON and PMOS transistor 20 turns OFF, preventing DC power draw through circuit 14. When all transistors in the parallel circuit 14 are OFF, all the transistors in the series circuit 16 are ON and pull down the gate of the PMOS transistor 20, which turns ON. As a result, PMOS transistor 18 turns, preventing DC power draw through circuit 16. Unfortunately, this design approach also has several drawbacks. The size of the array is large, mostly due to the sizing of the series NMOS transistors. Reliability is difficult to ensure because the number of busses in the NOR array is doubled. Moreover, functionality cannot be guaranteed independently of array size.

While other proposals have been made to overcome the disadvantages of the fully complementary and complementary NMOS designs, they do so at the expense of significant DC power dissipation. In one such design, known as a pseudo-NMOS static CMOS PLA, PMOS pullup transistors having their gates tied to ground are used on the NMOS array lines. While this approach results in a static PLA, the PMOS pullup transistors are essentially resistive pullups and dissipate a significant amount of DC power.

SUMMARY OF THE INVENTION

An object of the present invention is to provide a compact, static and reliable programmable logic array (PLA) structure that minimizes DC power dissipation.

These and other objects are achieved in the present invention. In accordance therewith, a programmable logic array having a number of inputs for receiving operand data and a number of outputs for furnishing the results of Boolean operations upon the operand data is provided with a precharge signal generator responsive to a transition in the operand data for generating a precharge signal. The operand data is furnished to an AND plane, and pullup circuits associated therewith are responsive to the precharge signal for charging the AND plane and sustaining the charge on all array lines in the logical ONE state. An OR plane is connected to the outputs of said AND plane, and pullup transistors associated with the OR plane are responsive to the precharge signal for charging the OR plane and sustaining the charge on all array lines in the logical ONE state. The PLA outputs are taken from the outputs of the OR plane.

BRIEF DESCRIPTION OF THE DRAWINGS

In the drawings, where like reference characters indicate like parts.

DETAILED DESCRIPTION OF THE PREFERRED EMBODIMENT

Figure 1:
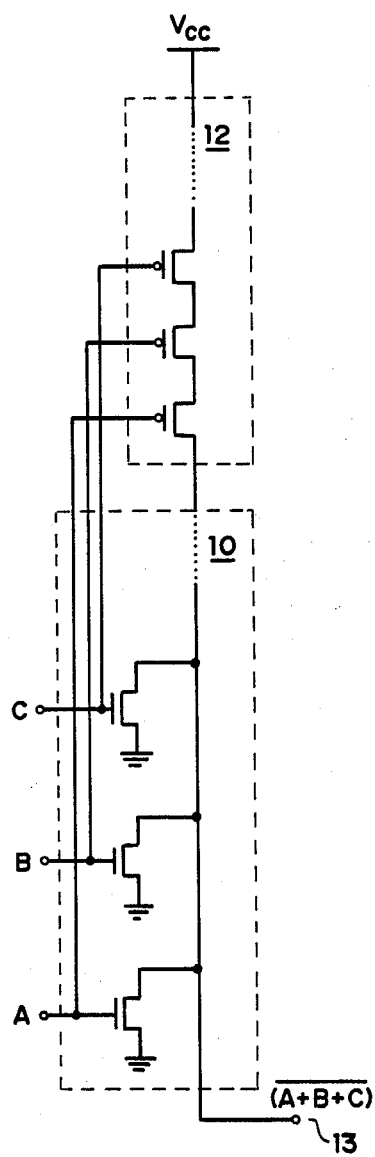
FIGS. 1 and 2 are schematic drawings illustrating prior art NOR arrays for static programmable logic arrays.
Figure 2:
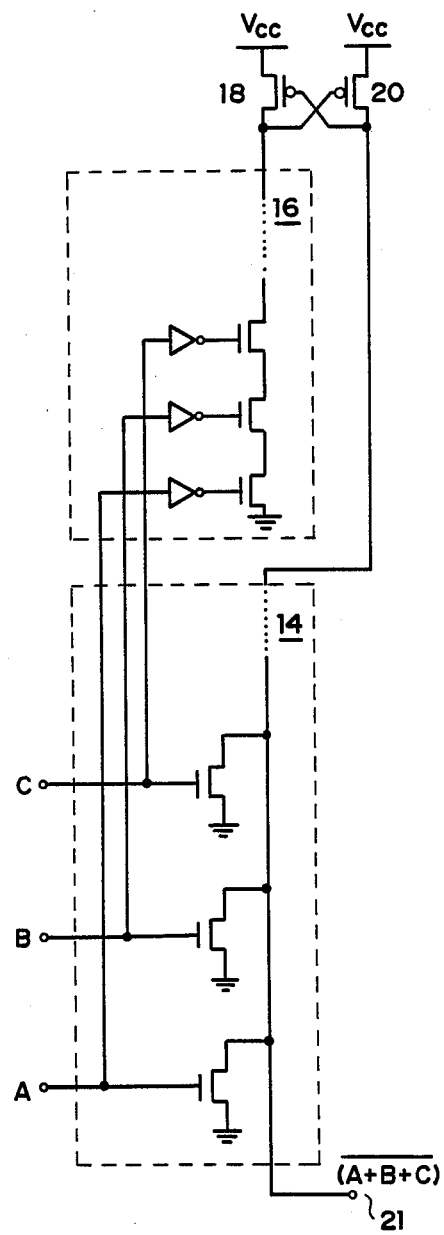
Figure 3:
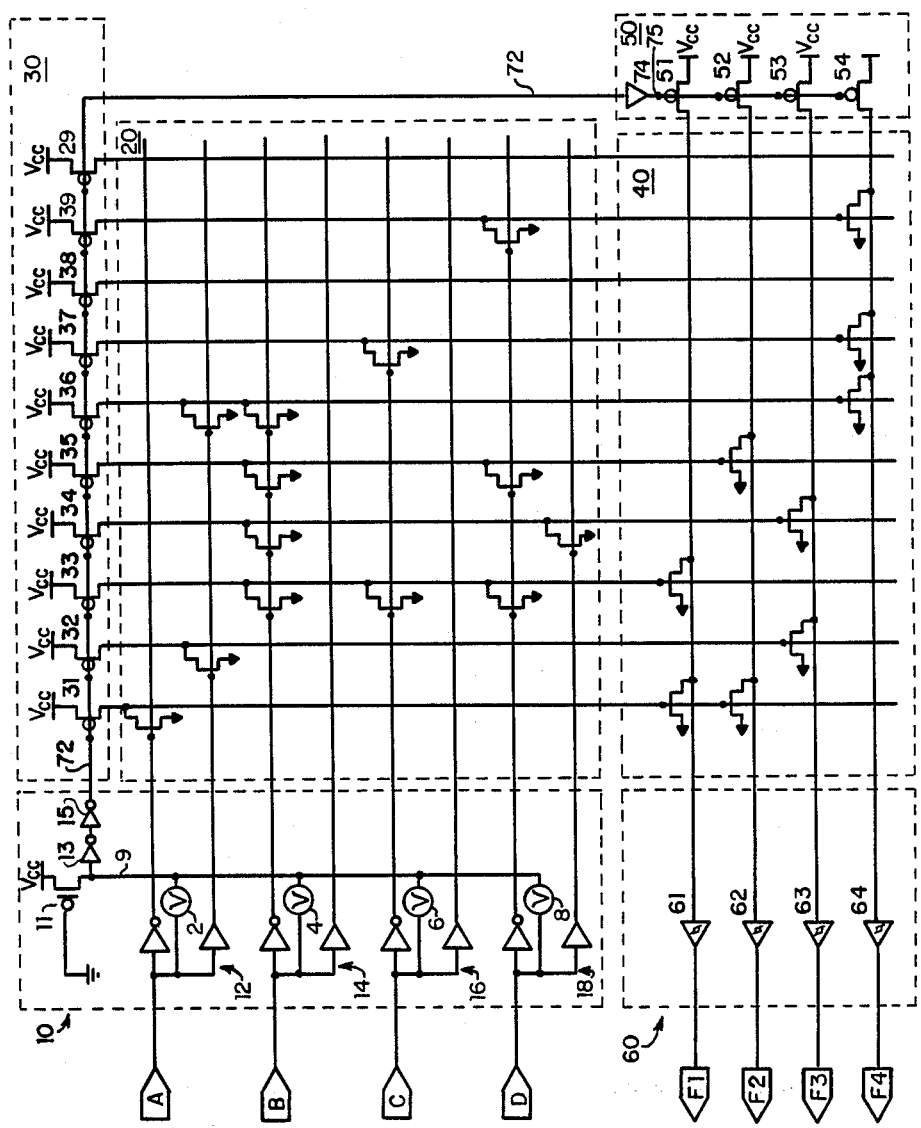
FIG. 3 is a schematic drawing of a programmable logic array in accordance with the present invention.

A simple programmable logic array (PLA) programmed to implement Boolean functions F1, F2, F3 and F4 from inputs A, B, C and D is shown in FIG. 3. The implemented Boolean functions are F1=A+B*C*D, F2=A+B*D, F3=A/+B*D/, and F4=A/*B+C+D. As will be appreciated from the description below, the PLA of the present invention is readily expandable for implementing any logical function that can be represented in a "sum of products" form.

The PLA of FIG. 3 may be envisioned as comprising four groups of circuits, an input buffer having precharge logic (block 10), an AND plane comprising a NMOS NOR array (block 20) and associated PMOS pullups (block 30), an OR plane comprising a NMOS NOR array (block 40) and associated PMOS pullups (block 50), and an output buffer (block 60).

Block 10 comprises four identical input buffers 12, 14, 16 and 18 represented symbolically; a representative input buffer circuit 100 is described below, with reference to FIG. 7. Input buffers 12, 14, 16 and 18 include respective precharge logic circuits 2, 4, 6 and 8, the outputs of which are connected to precharge line 9. Block 10 also comprises a precharge PMOS pullup transistor 11, which is a small "always ON" transistor having its gate tied to ground, its source tied to $V_{cc}$, and its drain connected to precharge line 9. The characteristics of transistor 11 depend on the transient nature of the precharge signal, as fully described below. Inverters 13 and 15 buffer the precharge line 9 from the circuits connected to precharge bus 72, and guarantee that new data is present at the AND plane 20 when the various PMOS pullup circuits of block 30 charge the array lines of AND plane 20.

Figure 4:
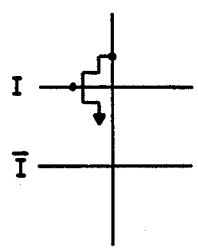
FIGS. 4 through 6 are schematic drawings illustrating the meaning of certain symbolism used in FIG. 3.
Figure 5:
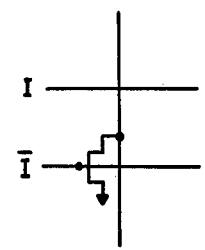
Figure 6:
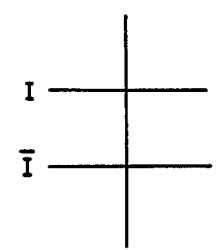

Block 20 is a conventional NMOS PLA array, fabricated and programmed in a manner well known in the art. The symbolism may be understood with reference to FIGS. 4, 5 and 6, which show respectively a logical one state, a logical zero state, and a "don't care" condition.

Block 30 comprises ten identical PMOS pullup circuits 31, 32, 33, 34, 35, 36, 37, 38, 39 and 29 represented symbolically; a representative PMOS pullup circuit 200 is described below, with reference to FIG. 8. The PMOS pullup circuits 31, 32, 33, 34, 35, 36, 37, 38, 39 and 29 have their respective control leads connected in parallel via precharge bus 72 to the output of the buffer comprising series connected inverters 13 and 15.

Block 40 is a conventional NMOS PLA array, fabricated and programmed in a manner well known in the art. The symbolism may be understood with reference to FIGS. 4, 5 and 6, which show respectively a logical one state, a logical zero state, and a "don't care" condition.

Block 50 comprises four identical PMOS pullup circuits 51, 52, 53 and 54, represented symbolically; a representative PMOS pullup circuit 200 is described below, With reference to FIG. 8. The PMOS pullup circuits 51, 52, 53 and 54 have their respective control leads connected in parallel via a second precharge bus 75 to the output of a precharge buffer 74, which buffers bus 75 from bus 72 and also guarantees that data is present at the OR plane 40 when the various PMOS pullup circuits of block 50 charge the array lines of OR plane 40. The precharge buffer 74 is described below, with reference to FIG. 9.

Block 60 comprises four identical output buffer circuits 61, 62, 63 and 64. The buffers 61–64 must be inverting, and must have a certain amount of hysteresis so that the output of the PLA is not degraded by glitches when the precharge is fighting the NMOS pulldown transistors in the NOR arrays 20 and 40. The hysteresis is achieved by use of an in-line latch, as is well known in the art.

The operation of the PLA of FIG. 3 is as follows. Upon the occurrence of a transition on any of the inputs A, B, C and D, line 9 momentarily is brought LOW for a preselected duration, thereby generating a precharge signal. This signal is buffered through inverters 13 and 15 and is furnished in parallel to the gates of PMOS pullup circuits 29 and 31–39, which are activated to charge the lines of the NOR array 20. Inverters 13 and 15 guarantee that the new data arrives at the NOR array 20 for evaluation before the PMOS pullup circuits 29 and 31–39 are activated.

The results of the evaluation by NOR array 20 are furnished to NOR array 40 for further evaluation. The precharge signal is further buffered through precharge buffer 74 and is furnished in parallel to the gates of PMOS pullup circuits 51–54, which are activated to charge the lines of the NOR array 40. The precharge buffer 74 guarantees that the results of the evaluation by NOR array 20 are furnished to NOR array 40 for evaluation before the PMOS pullup circuits 51–54 are activated.

The results of the evaluation by NOR array 40 are furnished to output buffer circuits 61–64 respectively.

Figure 7:
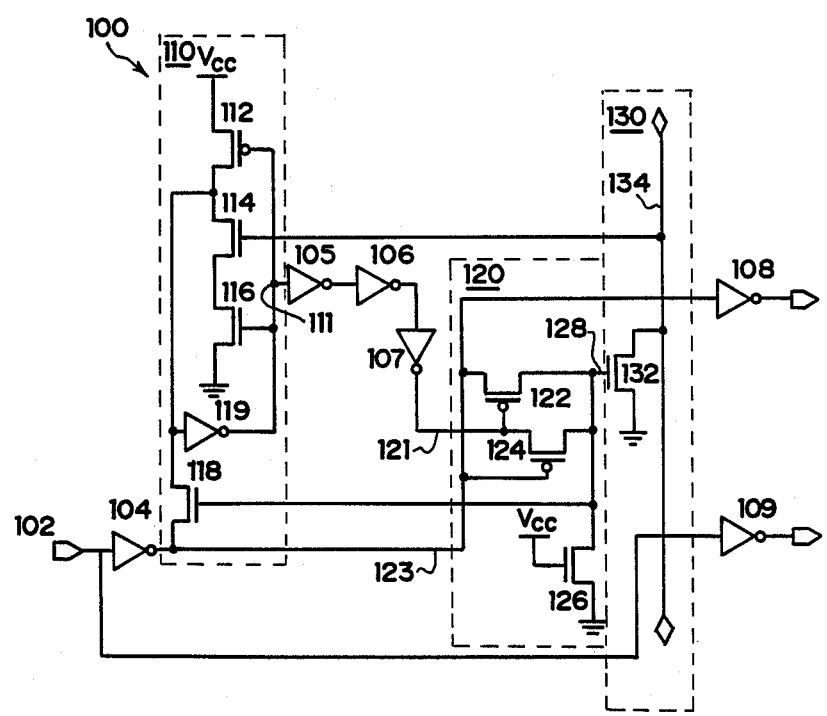
FIG. 7 is a schematic drawing illustrating a representative input buffer circuit in accordance with the present invention.

A representative input buffer circuit 100, which includes precharge logic circuitry, is shown in FIG. 7. Buffer 100 can be envisioned as comprising a latch circuit 110, an exclusive-OR gate 120, and a precharge pulldown circuit 130. When a transition occurs on input 102, the respective states of the input 102 and latch 110 are different. The EX-OR gate 120 is responsive to the difference in the respective states of the input 102 and latch 110, and generates a logical ONE at its output. The output of the EX-OR gate 120 is furnished to the precharge pulldown circuit 130 for changing the state of the line 134 from a logical ONE to a logical ZERO, and to the latch 110 for reading the new data at input 102 into the latch 110. The effect of the change in the logical state of the line 134 is described below with respect to the illustrative PMOS pullup circuit of FIG. 8. Once the new data passes through latch 110, the output of the EX-OR gate 120 returns to zero, which in turn both isolates the latch 110 from the input 102 and causes the state of the line 134 to return to a logical ONE.

A detailed description of the operation of the circuit 100 follows. Assume that the input buffer 100 initially is in a steady state condition, so that the output of the EX-OR gate 120 is LOW. The output 128 is applied to the gate of NMOS transistor 132. Transistor 132 therefor is OFF, and line 134 is at a logical ONE. The output 128 also is applied to the gate of NMOS transistor 118 in the latch 110. Transistor 118 is thereby in an OFF condition and isolates the latch 110 from the input 102, which is supplied via inverter 104.

Further assume that a logical ZERO is maintained at the input 102. The output 111 of latch 110 would be LOW as well, having latched this value earlier in a manner described below. The output 111 is applied to input 121 of the EX-OR gate 120 through inverters 105, 106 and 107, hence appearing as a logical ONE. The input 102 is applied to input 123 of the EX-OR gate 120 through inverter 104, hence appearing as a logical ONE.

Input 121 of the EX-OR gate 120 is applied to the gate of PMOS transistor 122 and the source of PMOS transistor 124, while input 123 of the EX-OR gate 120 is applied to the gate of PMOS transistor 124 and the source of PMOS transistor 122. The drains of transistors 122 and 124 are tied together to form the output 128 of the EX-OR gate 120. With both inputs 121 and 123

HIGH, neither transistor 122 nor 124 conducts and output 128 is LOW.

Assume now that a transition from ZERO to ONE occurs at the input 102. Input 123 of the EX-OR gate 120 swings from HIGH to LOW, thereby causing transistor 124 to conduct and the output 128 of the EX-OR gate 120 to swing from LOW to HIGH. The V-HIGH of output 128 is applied to NMOS transistor 118 in latch 110, turning it ON and causing the input of inverter 119 to be pulled down to V-LOW now present at the output of inverter 104. A logical ONE now appears at output 111 of latch 110, which propagates through inverters 105, 106 and 107 and appears at input 121 of the EX-OR gate 120 as a logical ZERO. With both inputs 121 and 123 LOW, neither transistor 122 nor 124 conducts and NMOS transistor 126 pulls down output 128, which returns LOW.

Output 128 also is connected to NMOS transistor 132. During the transition of output 128 from LOW to HIGH to LOW, transistor 132 turns ON briefly, thereby pulling down line 134 and generating a precharge signal. The trailing edge of the precharge signal turns ON NMOS transistor 114 in latch 110 at about the same time transistor 118 turns OFF; as both transistors 114 and 116 are ON, the input of inverter 119 is held LOW and the data is latched.

The operation of input buffer 100 during a transition from HIGH to LOW is now readily apparent, in view of the foregoing description.

It will be appreciated that the EX-OR gate 120 does not dissipate DC power because the output 128 of the EX-OR gate 120 is HIGH only during the transient precharge signal.

Figure 8:
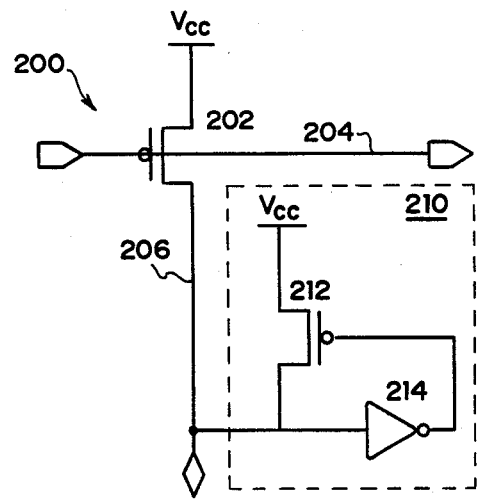
FIG. 8 is a schematic drawing illustrating a representative PMOS pullup circuit in accordance with the present invention.

A representative PMOS pullup 200 is shown in FIG. 8. PMOS transistor 202 has its source connected to Vcc, its drain connected to array line 206, and its gate connected to precharge bus 204 (corresponding to precharge bus 72 or 75 of FIG. 3, for example). Transistor 202 is designed to provide a moderate amount of current drive; a width of 9 microns and a length of 2 microns has been found satisfactory. To prevent charge from leaking from array line 206 after the transient precharge signal terminates, sustainer circuit 210 is provided. Sustainer circuit 210 comprises a PMOS transistor 212 having its source connected to Vcc and its drain connected to the array line 206. In addition, inverter 214 is connected between the drain and gate of transistor 212. Transistor 212 is designed to provide poor current drive; a width of 4 microns and a length of 4 microns has been found satisfactory. For reference, the NMOS transistors in the NOR plane are about 6 microns in width and about 2 microns in length.

Pullup 200 operates as follows. Transistor 202 is responsive to a transition from HIGH to LOW on precharge bus 204 for quickly providing charge to the array line 206. The current from transistor 202 terminates when the transient precharge signal on precharge bus 204 returns to the HIGH level. In the event that array line 206 goes to a logical ONE state as determined by the data, no NMOS transistors pull down against transistor 202. The output of inverter 214 goes low and transistor 212 turns ON to maintain charge on line 206 after transistor 202 turns OFF. The power dissipation is very low. In the event that array line 206 goes to a logical ZERO state as determined by the data, the input to inverter 214 generally is brought LOW and transistor 212 turns OFF. In the worse case of a single NMOS transistor pulling down against the transistor 202, transistor 212 may turn ON, but its drive is insufficient to pull up against the NMOS transistor once transistor 202 turns OFF, and it too rapidly turns OFF.

It will be appreciated that the transistor 202 does not dissipate DC power, because it is ON only during the transient precharge signal.

Figure 9:
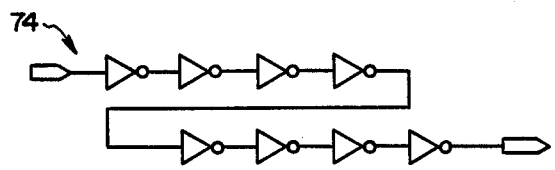
FIG. 9 is a schematic drawing illustrating a representative precharge buffer circuit.

The precharge buffer 74 illustrated in FIG. 9 is merely a delay chain designed to delay arrival of the precharge signal at PMOS pullup circuits 51, 52, 53 and 54 until all data arrives at the OR plane 40. Eight series connected inverters were found to be satisfactory.

While the invention has been described with reference to particular embodiments, the invention is not intended to be limited to these particular embodiments. Variations within the spirit and scope of the invention will occur to those skilled in the art.

What is claimed is:

1. A programmable logic array for performing Boolean operations upon operand data, comprising:
   a precharge signal generator responsive to new operand data for generating a precharge signal;
   an AND plane, said operand data being applied thereto;
   a plurality of pullup circuits associated with said AND plane and responsive to the output of said precharge signal generator for charging said AND plane in response to said precharge signal and sustaining charge in said AND plane;
   an OR plane connected to the outputs of said AND plane; and
   a plurality of pullup transistors associated with said OR plane and responsive to the output of said precharge signal generator for charging said OR plane in response to said precharge signal and sustaining charge in said OR plane.

2. A programmable logic array as in claim 1, wherein said precharge signal generator comprises:
   a precharge line;
   a pullup transistor connected to said precharge line; and
   a plurality of precharge logic circuits for generating a pulldown transient in response to a transition in said operand data, the inputs thereof being connected to respective operand data inputs and the outputs thereof being connected to said precharge line.

3. A programmable logic array as in claim 2, further comprising first and second precharge buffers and wherein:
   the control leads of said AND plane-associated pullup transistors are connected in parallel to a first precharge bus, said first precharge bus being connected through said first precharge buffer to said precharge line; and
   the control leads of said OR plane-associated pullup transistors are connected in parallel to a second precharge bus, said second precharge bus being connected through a second precharge buffer to said first precharge bus.

4. A programmable logic array as in claim 3, wherein:
   the delay characteristic of said first precharge buffer is selected to ensure that new operand data is present at said AND plane for evaluation when said AND plane is charged; and
   the delay characteristic of said second precharge buffer is selected to ensure that the results of the evaluation by said AND plane are present at said OR plane for evaluation when said OR plane is charged.

5. A programmable logic array as in claim 3, Wherein:
said AND plane comprises a NMOS NOR array;
said AND plane-associated pullup transistors are PMOS transistors;
said OR plane comprises a NMOS NOR array;
said OR plane-associated pullup transistors are PMOS transistors; and
said precharge line pullup transistor is a PMOS transistor.

6. A programmable logic array as in claim 2, wherein each of said precharge logic circuits comprises:
an operand input for receiving partial operand data; a latch;
an exclusive OR gate, one input thereof being responsive to the state present on said operand input and another input thereof being responsive to the state present on the output of said latch; and
a pulldown transistor connected to said precharge line and responsive to the change of state of the output of said exclusive OR gate for generating said precharge signal;
wherein said latch is responsive to said precharge signal for latching the state present on said respective operand input during the occurrence of said precharge signal.

7. A programmable logic array for performing Boolean operations upon operand data, comprising:
means for generating a precharge signal upon a state transition in said operand data;
means for performing programmable logic AND operations on said operand data, said AND operations means being charged in response to said precharge signal;
means for performing programmable logic OR operations on data furnished at the output of said AND operation means, said OR operations means being charged in response to said precharge signal; and
means for furnishing data provided on the output of said OR operations means to the output of the programmable logic array.

8. A programmable logic array as in claim 7, wherein said precharge signal generating means comprises:
a precharge line;
means for nominally maintaining said precharge line at a preselected state; and
a plurality of precharge logic means responsive to a state transition in operand data for generating a transient precharge signal of a second state different than said preselected state.

9. A programmable logic array as in claim 8, wherein each of said precharge logic means comprises:
an operand input line for receiving partial operand data;
means for retaining the state of said input line in the event of a change of state of said operand input;
means for initiating said precharge signal when the respective states of said operand input and said retaining means become different;
means for changing the state of said retaining means to match the state of said operand input in response to the initiation of said precharge signal; and
means for terminating said precharge signal when the respective states of said operand input and said retaining means become equal.

10. A programmable logic array comprising:
a precharge line;
a pullup transistor connected to said precharge line;
a plurality of input buffers, each having an operand input and each comprising:
a first inverter connected to said respective operand input, the output thereof being furnished to a second inverter, the output thereof being a noninverting output of said respective input buffer;
a third inverter, the output thereof being an inverting output of said respective input buffer;
a latch, the data input thereof being connected to the output of said first inverter;
an exclusive-OR gate, one input thereof being connected to the output of said first inverter and another input thereof being connected to the output of said latch; and
a pulldown transistor connected to said precharge line, the control lead thereof being connected to the output of said exclusive-OR gate;
an AND plane connected to the noninverting and inverting outputs of said input buffers;
a first precharge bus connected to said precharge line through a first precharge buffer;
a plurality of pullup transistors associated with said AND plane and having the respective control lines thereof connected in parallel to said first precharge bus;
an OR plane connected to the outputs of said AND plane; a second precharge bus connected to said first precharge bus through a second precharge buffer;
a plurality of pullup transistors associated with said OR plane and having the respective control lines thereof connected in parallel to said second precharge bus; and
an output buffer connected to the outputs of said OR plane.

* * * * *